United States Patent [19]

Wood

[11] Patent Number: 4,720,396
[45] Date of Patent: Jan. 19, 1988

[54] SOLDER FINISHING INTEGRATED CIRCUIT PACKAGE LEADS

[75] Inventor: Richard C. Wood, Portland, Me.

[73] Assignee: Fairchild Semiconductor Corporation, Cupertino, Calif.

[21] Appl. No.: 878,307

[22] Filed: Jun. 25, 1986

[51] Int. Cl.⁴ ............................................... B05D 5/12
[52] U.S. Cl. .................................... 427/96; 118/50.1; 118/401; 118/410; 118/423
[58] Field of Search ................ 427/96; 118/401, 423, 118/50.1, 410; 228/6.2

[56] References Cited

U.S. PATENT DOCUMENTS

| | | | |
|---|---|---|---|
| 3,196,830 | 7/1965 | Lehovec | 118/401 |
| 3,593,677 | 7/1971 | McLain | 427/96 |
| 3,713,876 | 1/1973 | Lavric | 427/96 |
| 4,383,494 | 5/1983 | Schillke | 118/423 |
| 4,512,510 | 4/1985 | Kondo | 118/423 |
| 4,570,569 | 2/1986 | Kondo | 118/423 |
| 4,603,804 | 8/1986 | Takeda | 228/6.2 |

*Primary Examiner*—Sam Silverberg
*Assistant Examiner*—Vi Duong Dang
*Attorney, Agent, or Firm*—Stephen J. Phillips; David H. Carroll; Daniel H. Kane, Jr.

[57] ABSTRACT

A new method for solder finishing the leads of an integrated circuit package such as a DIP having two parallel rows of leads along the sides of the package. The method contemplates establishing two vertical columns of falling molten solder and spacing the columns apart a distance substantially the width of the package. The package is passed between the vertical columns of falling molten solder immersing the two parallel rows of leads along the sides of the package in the respective columns of molten solder, washing the leads and depositing a finishing layer of solder over the surfaces of the leads. The method further contemplates directing hot nonreacting gas over the leads of the package as the package passes from the columns thereby eliminating excess solder and bridging of solder between the leads. A monorail track system and a new solder bridge for implementing the method are described. The invention may be applied for column fluxing as well as for other column liquid treatments.

25 Claims, 8 Drawing Figures

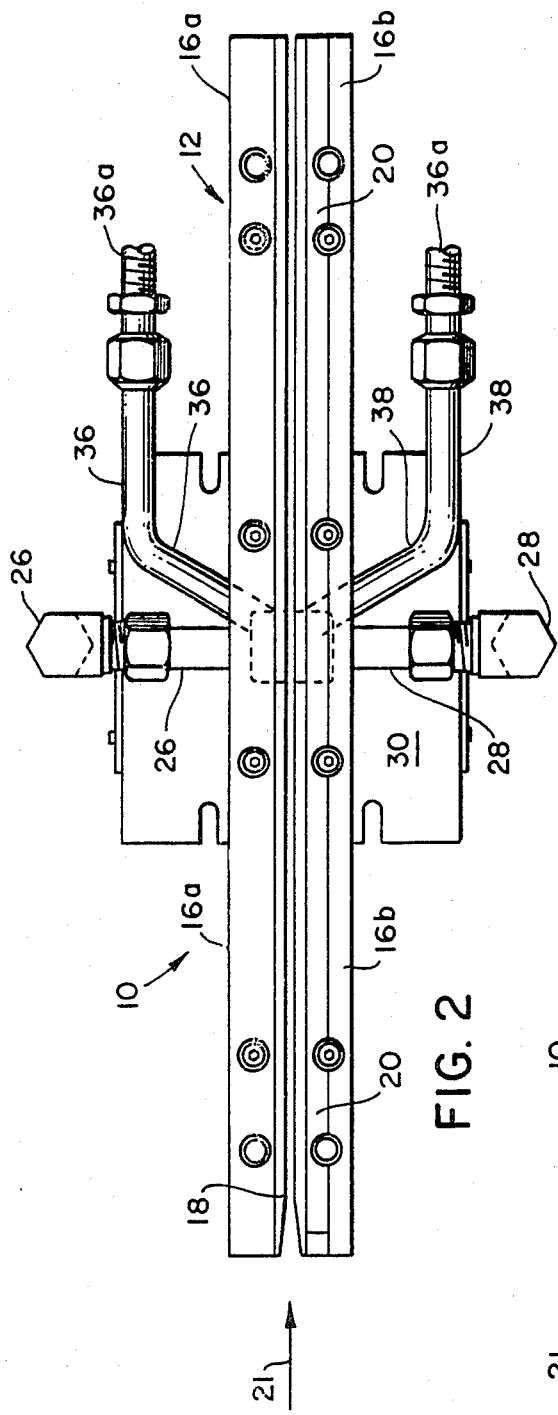
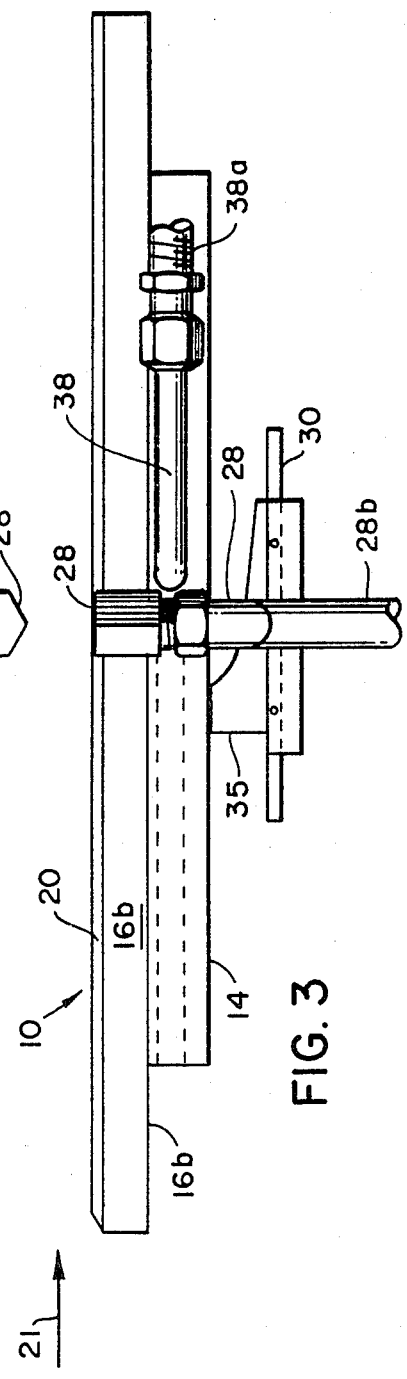
FIG. 2
FIG. 3

SOLDER FINISHING INTEGRATED CIRCUIT PACKAGE LEADScl TECHNICAL FIELD

This invention relates to new apparatus and methods for solder finishing the leads of integrated circuit packages such as dual in-line packages (DIP's). In particular, the invention provides a new solder bridge track section for monorail system equipment used for conveying and final finishing of integrated circuit packages.

BACKGROUND ART

In the final stages of integrated circuit manufacturing, packaging, and testing, the integrated circuit package leads or terminals are finished with solder. The package leads are immersed in solder which flushes and cleans the leads and covers the leads with a solder finish for good electrical contact.

According to the conventional method, the leads depending downwardly from the sides of the package are solder finished by immersion in a "wave" of solder which rises from below the package immersing and covering the leads. The wave is generated in a solder pot or solder reservoir with the integrated circuit packages suspended or conveyed above.

In the monorail system for conveying and solder finishing the packages, the integrated circuit packages are conveyed along a track riding on a pair of adjacent rods which form the "monorail". The row of leads along each side of the packages depend in a downward direction on each side of the monorail. The track is assembled from track sections and a chain conveyor with extending fingers or lugs pushes the packages along the monorail formed by the track sections. The monorail track sections convey the packages over the solder pot or molten solder reservoir where a standing wave of solder is formed. The IC package leads pass through the crest of the standing wave and are thereby immersed, flushed and cleaned, and solder finished.

The track section over the solder pot or molten solder reservoir is referred to as the "solder bridge" and provides the locus of solder finishing. The solder bridge is a monorail track section where the depending leads along the sides of the package on either side of the pair of suspending rods are immersed in the standing wave as they are pushed along the track by an extending finger or lug of the chain conveyor. Alternatively, as many as 200 or 300 IC packages are mounted and suspended in a "pallet" over the solder pot and a large standing wave immerses the leads from below.

A disadvantage of the conventional methods of solder standing wave immersion is that excess solder accumulates on the leads, bridging between leads or between leads and monorail track section support rods. Solder also tends to accumulate on the package track section and conveying equipment. For example, fingers or lugs extending from the chain drive tend to pick up solder from the solder pot wave or solder reservoir wave. Solder also tends to accumulate along the monorail suspension or support rods of the track sections requiring regular cleaning. Similarly, where pallets are used for mounting and suspending IC packages, the solder tends to accumulate on the pallet equipment.

OBJECTS OF THE INVENTION

It is therefore an object of the present invention to provide a new method and new apparatus for solder finishing the terminal leads of integrated circuit packages which eliminates undesirable solder accumulation on the package conveying and solder finishing equipment and avoids bridging of solder between leads and between leads and conveyor supports. In particular, the invention seeks to eliminate the conventional method of solder finishing by immersion in a standing wave of solder from below.

Another object of the invention is to provide a new package conveyor track system which eliminates the monorail support rods but which may be integrated with the conventional chain conveyors for pushing packages along the new track system.

A further object of the invention is to provide a new solder bridge track section and solder finishing method which immerses the rows of depending package terminal leads in molton solder without contacting, immersing, or accumulating solder on the package transporting and conveying equipment.

Yet another object of the invention is to provide a solder bridge track section and solder finishing method which affords a hot nonreactive post-solder application environment for eliminating bridging of solder between elements and flags of solder at the ends of elements, preventing accumulation of excess solder, and drying and elimination of moisture.

DISCLOUSRE OF THE INVENTION

In order to accomplish these results, the invention provides a new method for solder finishing the leads of an integrated circuit package such as a DIP having two parallel rows of leads along the sides of the package. The invention contemplates establishing two vertical columns of falling molten solder and spacing the columns apart a distance substantially the width of the package. The package is passed between the vertical columns of falling molten solder immersing the two parallel rows of leads along the sides of the package in the respective columns of molten solder, washing the leads and depositing a finishing layer of solder over the surfaces of the leads. The invention further contemplates directing hot nonreacting gas over the leads of the package as the package passes from the columns thereby eliminating excess solder and bridging of solder between the leads.

To accomplish this method the invention provides first and second solder passageways for delivering molten solder. The solder passageways are formed with downwardly directed outlets spaced apart substantially the width of the integrated circuit packages. A conveyor is provided for conveying the integrated circuit packages between and below the solder passageway outlets, immersing the two parallel rows of leads along the sides of the package in the respective columns of molten solder falling from the solder passageway outlets. A feature and advantage of this arrangement is that the leads are washed and cleaned with molten solder and a finishing layer of solder is deposited over the surfaces of the leads without immersing the package conveyor equipment in a solder standing wave.

Hot gas such as nitrogen is discharged and directed over the leads of the package as the package passes from the columns by providing for example, first and second hot gas passageways adJacent to and downstream from the solder passageways for directing hot gas over the leads as packages pass from the columns of falling molten solder. The first and second hot gas passageways are positioned on either side of the conveyor and oriented for directing the nonreactive hot gas over the leads from the sides.

A feature and advantage of this arrangement is that a hot post-solder application environment is afforded for preventing accumulation of excess solder and elimination of solder bridging and solder flags. At the same time the hot dry gas, selected to be nonreactive with the solder components, dries and eliminates moisture from the soldering environment.

In the preferred embodiment the integrated circuit package conveyor comprises track sections including an elongate solder bridge track section defining the locus of solder finishing. The solder bridge track section is formed with a conveyor channel for conveying integrated circuit packages through the locus of solder finishing. The first and second solder passageway outlets are positioned on either side of the conveyor channel at the locus of solder finishing of the solder bridge track section. Similarly the hot gas passageways are operatively coupled to the locus of solder finishing of the solder bridge track section downstream from the solder passageway outlets in the direction of travel of IC packages through the conveyor channel of the solder bridge track section.

In the preferred example the locus of solder finishing comprises a recess or chamber formed in the solder bridge track section open at the bottom. The solder passageway outlets are positioned at the top of the recess or chamber for establishing the falling columns of molten solder. The hot gas passageways are positioned with outlets at the sides of the recess or chamber formed in the solder bridge track section adjacent to but downstream from the solder passageway outlets in the direction of travel of the packages. The first and second hot gas passageways therefore direct streams of hot gas, nonreactive with the solder, from the sides of the chamber onto the leads along the sides of the packages as the packages emerge from the columns of falling molten solder. A gas suitable for use as the heated cover gas is nitrogen.

According to the invention molten solder is delivered to the solder passageway outlets under positive pressure slightly greater than the gravity head of pressure at the solder passageway outlets. This is accomplished by pumping and delivering molten solder from a solder pot or other molten solder reservoir through the first and second solder passageways to the solder passageway outlets in the solder bridge track section. The solder bridge track section is generally positioned over the solder pot or reservoir. A ramp positioned below the open bottom recess or chamber at the locus of solder finishing and in the path of the columns of falling molten solder diverts and directs the solder back to the solder pot or reservoir.

Thus the invention provides an elongate solder bridge track section having an elongate package conveyor channel for conveying integrated circuit packages through the track section with leads oriented in downwardly depending position. The conveyor channel passes through a recess or chamber in the solder bridge track section which forms the locus of solder finishing. The first and second solder passageways at the locus of solder finishing deliver falling columns of molten solder in which the rows of leads are immersed as the packages pass through the recess or chamber. Hot gas is directed from the sides of the recess or chamber onto the depending leads along the sides of the package as the package passes from the columns of falling molten solder.

A feature and advantage of the present invention is that it provides a fluxless system for solder finishing the IC package leads. Flux cleaning to the base metal is unnecessary because the integrated circuit package lead frame leads are initially electroplated with tin following packaging while the shorting bar is still on the frame electrically coupling the leads together. Following tin plating of the clean base metal by electroplating the shorting bar is clipped off and the chip is subject to final loading and testing. During the loading, testing and burn-in stages the leads are protected by the electroplated tin layer which provides a working layer during the final steps. Solder finishing takes place at the end of these steps. Bathing, washing and cleaning of the leads immersed in the columns of falling molten solder removes the tin plate to the clean exposed base layer to which the finishing solder adheres.

The invention thus achieves the objective of eliminating the standing solder wave method of solder immersion with its consequent unwanted accumulation of excess solder not only on leads but also on package conveying equipment. Furthermore the invention provides a hospitable post-solder application environment for completion of the solder finishing by permitting removal or preventing accumulation of excess solder and elimination of bridging and flagging. The invention may also be applied for column fluxing by substituting flux for the solder as hereafter described and in two-stage systems for column fluxing and then column soldering. Other objects, features and advantages of the invention are apparent in the following specification and accompanying drawings.

BRIEF DESCRIPTION OF THE DRAWINGS

FIG. 2 is a plan view from above, FIG. 3 a side elevation view, and FIG. 4 an end view from the package input end of the solder bridge track section.

FIG. 6A is a diagrammatic side cross section through a package lead electroplated with a tin layer, while

DESCRIPTION OF PREFERRED EXAMPLE EMBODIMENTS AND BEST MODE OF THE INVENTION

Figure 1:
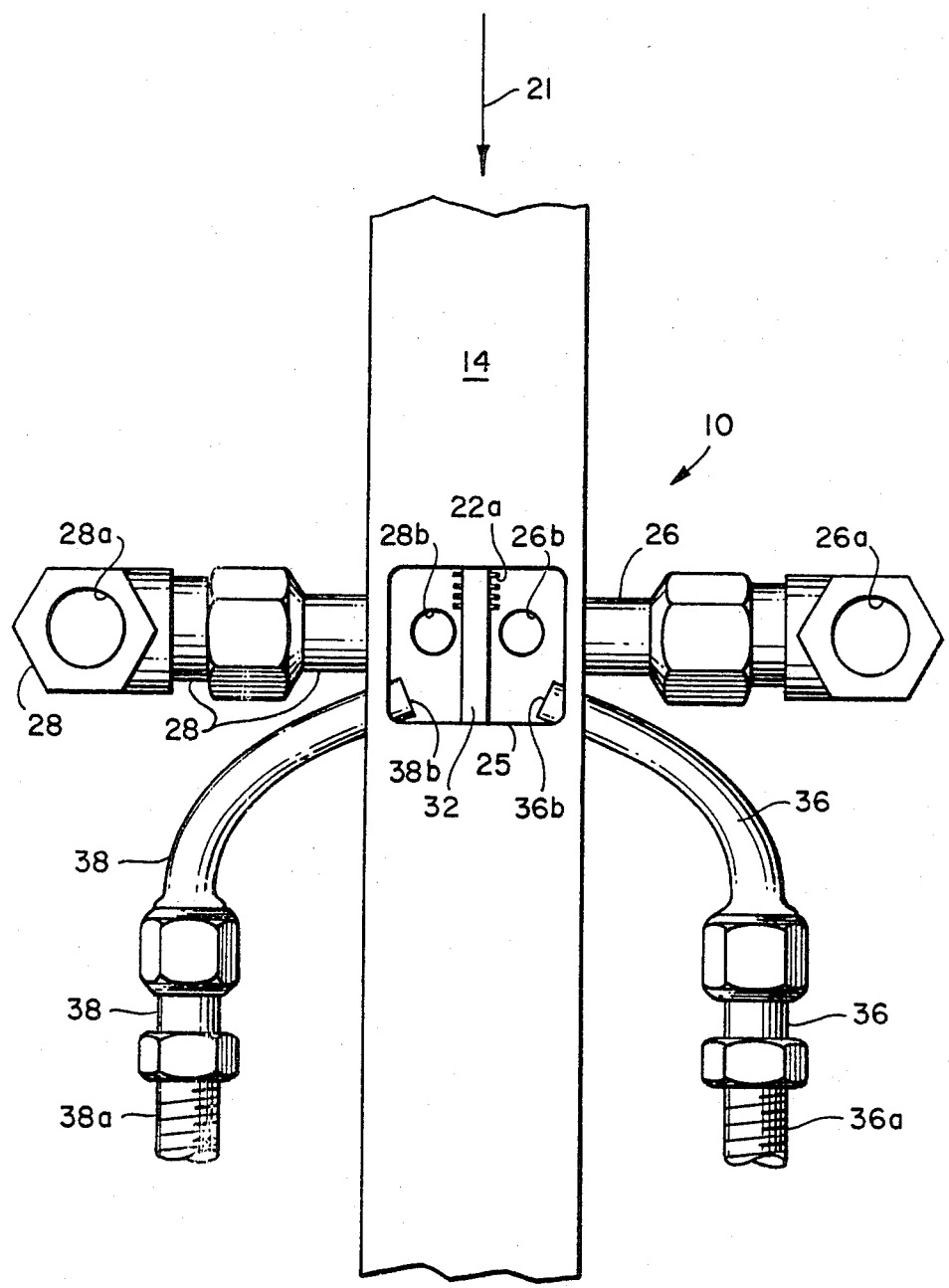
FIG. 1 is a fragmentary enlarged cross sectional view from below in the direction of the arrows on line 1—1 of FIG. 4 of a solder bridge track section according to the present invention showing the recess or chamber defining the locus of solder finishing, the solder passageway outlets for delivering columns of falling molten solder, and the hot gas passageway outlets for delivering streams of hot gas which provide the post-solder application environment.

A solder bridge track section 10 implementing the method and apparatus of the present invention is illustrated in FIGS. 1 through 4. The elongate conveyor track 12 is formed by a track base 14 in which is formed the elongate package conveyor channel 15. The track cover elements 16A and 16B define the top of the package conveyor channel 15 and are spaced apart to leave a slot or key 18.

At least one of the track cover elements, for example element 16B is formed with a raised index edge or guide edge 20 for guiding a conventional chain conveyor (not shown) which rides along the top of the track section 10. The chain conveyor is formed with depending fingers or lugs which extend into the slot 18 and push successive packages 22 through the channel 15. The direction of travel of packages 22 through the track section 10 and channel 15 is indicated by arrows 21 in FIGS. 1–4. Such a chain conveyor with depending fingers or lugs may be, for example, the type used with the monorail package conveyor system available from Electrovert of Montreal, Canada and Dallas, Tex.

While the conveyor track 12 including the track base 14 and cover elements 16a and 16b are constructed for example of stainless steel, the index edge or guide edge 20 may be made of a durable resistant plastic such as Teflon (Trademark) for longer wear. A high density polypropylene plastic may be used for the index edge on other track sections while Teflon (Trademark) is the preferred plastic for the index edge on the solder bridge track section as shown in FIGS. 1 through 4.

The track base 14 of the package conveyor track 12 is formed near the middle of the track section with a cutout or recess 25 amounting to a chamber open at the bottom which forms the locus of solder finishing as illustrated for example in FIG. 1. The cutout or recess 25 in the track base 14 provides the opening where a pair of vertical columns of falling molten solder are established according to the invention. In order to establish the columns of falling molten solder solder passageways 26 and 28 are provided on either side of the conveyor track 12 for delivering hot molten solder to the recess or chamber 25. The solder passageways 26 and 28 are provided by stainless steel tubing and stainless steel compression fittings. The solder passageways 26 and 28 coupled to the solder bridge 10 are provided with downwardly extending inlet tubes 26a and 28a a for extending into the hot molten solder of a solder pot or molten solder reservoir as hereafter described. The downwardly extending inlet tubes 26a and 28a are supported by the solder bridge support plate 30.

The outlet ends of the solder passageways 26 and 28 for delivering molten solder pass through the respective track cover elements 16a and 16b to the top or the roof of recessed chamber 25 at the locus of solder finishing. The solder passageways 26 and 28 terminate respectively in the downwardly directed outlets or outlet openings 26b and 28b respectively at the top of the recess 25. The openings 26b and 28b are formed by way of example with a diameter of ¼ inch (0.6 cm). The downwardly directed solder passageway outlet 26b and 28b b are spaced apart on either side of the package conveyor channel defining ridge, rib, or projection 32. The ridge or rib 32 is retained in the recess or chamber 25 and remains to support IC packages conveyed along the solder bridge conveyor track section 10 after the recess 25 is cut out from the track base 14.

The packages 22 ride on and along the channel ridge or rib 32 with the integrated circuit package leads 22a depending in a downward direction overlapping the channel rib 32 on either side. The package leads 22a are exposed on either side of the rib 32 as the package passes through chamber 25, the locus of solder finishing. According to the present invention the channel ridge or rib 32 effectively provides a monorail for supporting the packages as they pass through the channel 15 pushed by fingers from the chain conveyor, not shown. The channel ridge or rib 32 is also formed with a central indentation in which the depending fingers from the chained conveyor can rest as the fingers push the IC packages through the channel 15 of the track conveyor 12.

Figure 4:
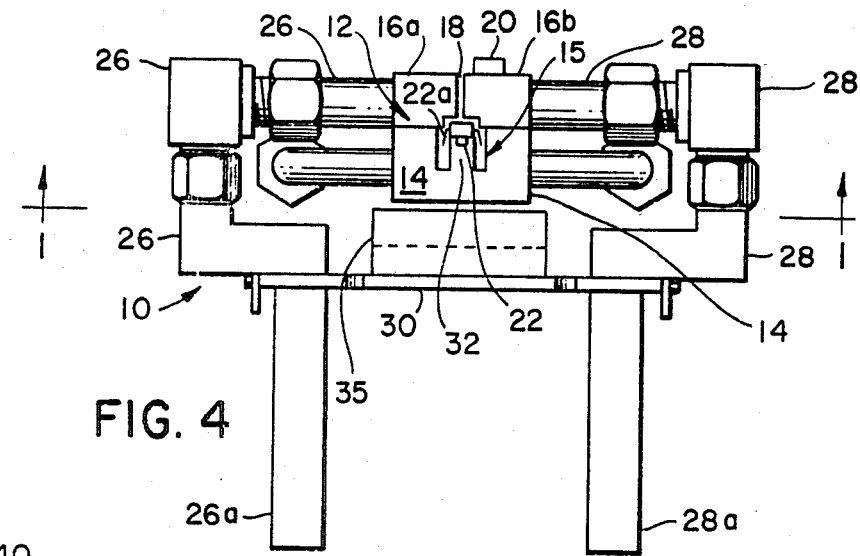

As the IC package 22 is pushed through the conveyor channel 15 in the direction 21 supported on the "monorail" or channel rib 32, it passes through the locus of solder finishing at recessed chamber 25 with the depending package leads 22 exposed on either side of the center channel rib 32 so that the rows of leads 22a on either side of the package are immersed and bathed in columns of molten solder falling from the downwardly directed solder passageway outlet openings 26b and 28b as hereafter described. The hot molten solder at a temperature of, for example, 280° C. is delivered by pumping through passageways 26 and 28 with positive pressure slightly in excess of the gravity head of pressure that would be established at the outlet openings 26b and 28b. As shown in FIGS. 3 and 4, the vertical columns of falling molten solder impinge on a ramp 35 mounted on the solder bridge support plate 30 below the locus of solder finishing. The falling molten solder is diverted or directed down the ramp 35 and back to the solder pot, pool, or reservoir of molten solder for pumping and recycling through the solder passageways.

The solder bridge track section 10 is also constructed with first and second hot gas passageways 36 and 38, using for example, stainless steel tubing with appropriate stainless steel compression fittings. The compression fittings at the inlet ends 36a and 38a are constructed and arranged for appropriate coupling to a source of hot nonreactive gas such as heated nitrogen at a temperature of for example 280° C. The hot nitrogen gas is delivered for example at a flow rate of 45 standard cubic feet per hour (SCFH). The respective outlet ends 36b and 38b of the hot gas passageways 36 and 38 are fitted into and enter the sides of the track base 14 so that they are disposed at the sides of the recess or chamber 25 on either side of the conveyor track channel 15 downstream in the direction of package travel 21 from the solder passageway outlet openings 26b and 28b. By this arrangement the hot gas streams which are nonreactive with the solder impinge upon the integrated circuit package leads 22a as they emerge from the columns of falling molten solder. The hot gas discharged in the recess or chamber 25 establishes in the chamber a beneficial post-solder application environment for final settling of the solder. The high temperature nonreactive environment prevents accumulation of excess solder and bridging of solder between leads or between leads and the conveying equipment. In the cross section illustration of FIG. 1, the solder bridge support plate 30 and ramp 35 are removed to provide an unobstructed view of the recess or chamber 25 defining the locus of solder finishing.

Figure 5:
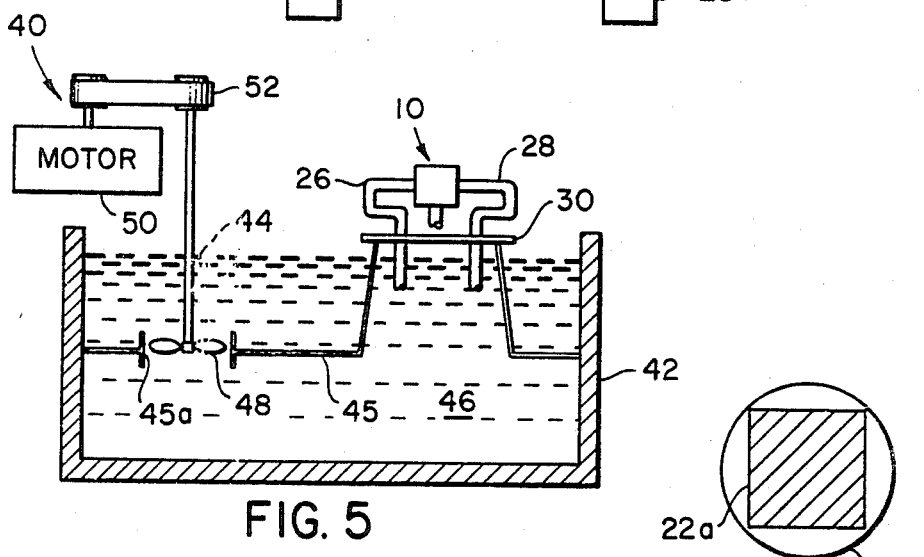
FIG. 5 is a diagrammatic side cross section of a solder pot or molten solder reservoir showing the flow of molten solder through the solder bridge.

A diagrammatic illustration of the molten solder pumping and cycling system 40 is illustrated in FIG. 5. The solder bridge track section 10, part of a elongate track conveyor is mounted over a solder pot or molten solder reservoir 42 with the molten solder level shown at 44. The molten solder is typically a eutectic solder having a composition of 63% tin and 37% lead. The heating elements of the solder pot 42 are controlled to maintain a molten solder temperature of for example 280° C.

The solder bridge track section 10 is supported over the solder pot 42 at the solder plate 30 by partition supports 45 which also define a pressurized space 46 from which molten solder under positive pressure is delivered to the solder passageways 26 and 28. Positive pressure is imparted by the pump slightly in excess of the gravity head of molten solder at the solder passageway outlets 26b and 28b. Outlets 26b and 28b are positioned for example approximately 3 to 4 inches (7.62 to 10 cm) over the solder level 44 in solder port 42. Positive pressure is established by centrifugal pump 48 positioned in the supporting partition opening 45a a and driven by pump motor 50. Pump motor 50 remote from the molten solder may be coupled to drive the centrifugal or propeller pump 48 for example by means of belt drive 52.

Figure 6B:
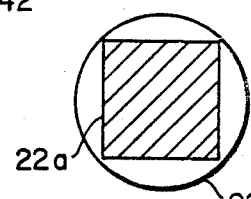
FIG. 6B is a side cross section through the solder finished package lead.
Figure 6:
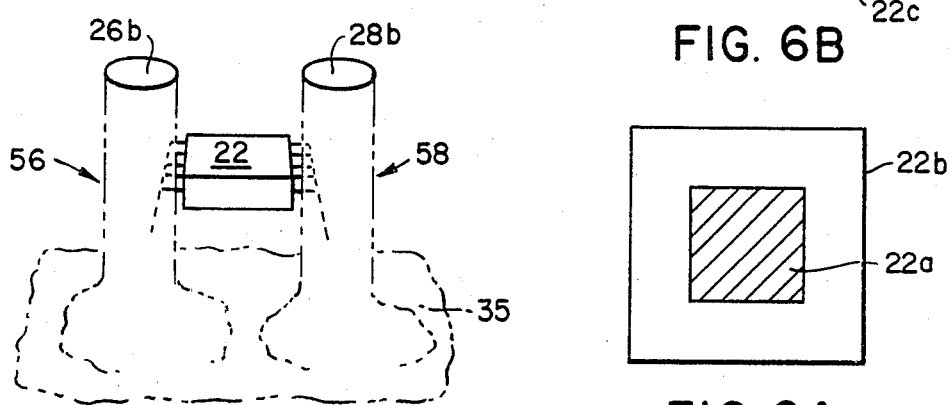
FIG. 6 is a diagrammatic rendering of the method of the invention showing a DIP with leads immersed in spaced vertical columns of falling molten solder.

A diagrammatic representation of the method of the invention is illustrated in FIG. 6. Vertical columns 56 and 58 of falling molten solder are established from downwardly directed solder passageway openings 26b and 28b. The vertical columns 56 and 58 are spaced apart substantially the width of DIP 22 which is passed between the columns immersing the leads in the solder columns.

Figure 6A:
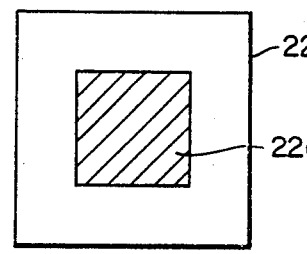

As the vertical columns of falling molten solder wash over and bath the integrated circuit package leads 22a, the electroplated tin layer 22b as shown in FIG. 6A, is melted, washed away and removed leaving the clean bare base metal. A finishing layer of molten solder 22c remains on the base metal of the package leads 22a as illustrated in FIG. 6B. By this arrangement using tin electroplating of the package leads prior of the final loading and testing steps, the present invention provides a fluxless system. The solder flushes and cleans the electroplated tin which melts at 230° C. leaving the clean bare metal of the package leads 22a.

According to the present invention the solder bridge track section 10 is part of a longer integrated circuit package conveyor comprising additional track sections necessary to provide the desired length of travel. The solder bridge track section 10 however is removable and replaceable for accommodating different IC package widths and sizes. Thus, for the standard 300 mil wide DIP's which include a range of ceramic package widths such as 250, 270 and 290 mils all measuring 300 mils from the lead elbows along the row of leads on one side to the lead elbows along the row of leads on the other side, different solder bridge track sections 10 are provided. The solder bridge track 12, track base 14 and track covers 16a and 16b are sized accordingly in each instance to define channel dimensions 15 which accommodate the DIP ceramic package width. The solder bridge track section 10 is removed and replaced with another solder bridge sized to accommodate the different width packages. In each instance the chain drive conveyor rides along the top of the track section positioned by the index edge 20 with depending fingers in the finger slot 18 for pushing packages through the conveyor channel 15.

The overall conveyor track may be constructed and arranged so that the input track sections define a downhill ramp into the chain conveyor for receiving DIPs from the loading and testing line. Similarly downstream from the solder bridge track section and the locus of solder finishing the track sections may be arranged to provide another downhill ramp exit from the chain conveyor through a package counter and into the handling tubes.

According to an additional feature of the invention, the complementary track sections upstream and downstream from the solder bridge track section 10 may be formed with track cover elements 16a and 16b of tapering width starting with a thinner width upstream form the solder bridge tract section and building gradually to the thickness of the track cover element 16a and 16b at the solder bridge track section 10 in order to provide clearance for the depending fingers over the recess or chamber 25 which defines the locus of solder finishing. Similarly downstream from the solder bridge track section the thickness of the track cover elements may be tapered to decrease gradually to a thinner cross section permitting the depending fingers to extend once again to a greater depth.

In another embodiment the invention contemplates column fluxing or column treatment using the method and apparatus illustrated in FIGS. 1 through 5 except substituting cleaning flux or other liquid treatment material for the hot molten solder. In this application the invention may be used for cleaning integrated circuit package leads and other microcircuit leads or other applications by immersing the leads in vertical columns of falling heated liquid flux or liquid treating material. The leads are cleaned to the bare base metal by the method and apparatus for column fluxing with the same features and advantages as column soldering. Further downstream along the track conveyor the packages may be solder finished by the method and apparatus for column soldering as heretofore described.

Thus the invention also contemplates a package conveyor including an elongate conveyor track with first and second stations. The first station comprises a flux bridge track section using the apparatus for example as described in FIGS. 1 through 5 but substituting flux for solder. The second station downstream along the conveyor track comprises a solder bridge track section, for example as described in FIGS. 1 through 5 for column solder finishing package leads as heretofore described. The conveyor track may be constructed with entrance and exit ramps for delivering DIPs sequentially to the first and second stations for successive column fluxing and column solder finishing and for delivering the finished DIPs to a counter and for example to handling tubes.

In both instances the streams of hot nonreactive gas such as nitrogen produces a beneficial hot, nonreactive environment for completion of the respective flux cleaning and solder finishing steps. The two stage embodiment of the invention is for example particularly applicable where the IC package leads are not electroplated with tin as the working layer for final loading and testing steps. Alternatively, the present invention contemplates providing column fluxing or other column treatment using the apparatus and methods of FIGS. 1 through 5 with cleaning flux or other liquid treating material for other applications and purposes without the subsequent column soldering step. Furthermore, the column soldering method and apparatus may be useful in a variety of other soldering applications than here described by way of example.

While the invention has been described with reference to particular example embodiments it is intended to cover all modifications and equivalents within the scope of the following claims.

I claim:

1. A method for solder finishing the leads of an integrated circuit package having two parallel rows of leads along the sides of the package comprising:

establishing two vertical columns of falling molten solder and spacing the columns apart a distance substantially the width of the package:

passing the package between the vertical columns of falling molten solder and immersing the two parallel rows of leads along the sides of the package in the respective columns of molten solder, washing the leads with molten solder and depositing a finishing layer of solder over the surfaces of the leads;

directing hot gas over the leads of the package as the package passes from the columns thereby eliminating accumulation of excess solder and bridging of solder between the leads.

2. The method of claim 1 wherein the step of establishing two vertical columns of falling molten solder comprises pumping molten solder from a solder pot and establishing a head of molten solder a selected distance above the solder pot in two separate solder passageways, and discharging molten solder through downwardly directed openings from the two solder passageways, said openings being spaced apart substantially the width of the package.

3. The method of claim 2 wherein the step of establishing two vertical columns of falling molten solder comprises pumping molten solder from a solder pot and establishing a head of molten solder with positive solder pressure at said downwardly directed openings.

4. The method of claim 1 wherein the step of passing the package between the vertical columns of molten solder comprises providing a track comprising an internal channel for receiving and conveying integrated circuit packages with the leads in downwardly depending position, establishing the two vertical columns of falling molten solder on either side of the channel at a locus of solder finishing, and pushing the package along the channel through the locus of solder finishing.

5. The method of claim 4 wherein the step of establishing two vertical columns of falling molten solder comprises pumping molten solder from a solder pot and establishing a head of molten solder at a selected distance above the solder pot in two separate solder passageways, and discharging molten solder from the two solder passageways through downwardly directed openings positioned on either side of the channel of said track at the locus of solder finishing.

6. The method of claim 5 wherein the step of directing hot inert gas over the leads of the package comprises providing two hot gas passageways with discharge openings on either side of said channel at the locus of solder finishing adjacent to and downstream from the solder passageway openings in the direction of travel of the package through the channel, and discharging hot gas through said hot gas passageways against the depending leads of packages passing from the columns of falling molten solder.

7. The method of solder finishing of claim 1 further comprising the step of eliminating the use of flux during the method of solder finishing.

8. The method of claim 1 wherein the step of directing hot gas over the leads of the package comprises directing two streams of hot gas along the respective sides of the package as the package passes from the columns of falling molten solder.

9. A for liquid treating the leads (22a) of a package (22) having two rows of leads along the sides of the package using treatment liquid comprising:

releasing treatment liquid from downwardly directed openings (26b, 28b), establishing two vertical columns (56,58) of exposed falling treatment liquid and spacing the columns apart a distance substanially the width of the package; and passing the package (22) between the vertical columns (56,58) of falling treatment liquid and immersing the two rows of leads (22a) along the sides of the package in the respective columns of treatment liquid from the sides of the columns, treating the leads with treatment liquid.

10. Apparatus for liquid treating the leads (22a) of packages (22) having two rows of leads along the sides of the packaging using treatment liqud comprising:

treatment liquid delivery means (26,28) constructed and arranged for delivering treatment lliquid, said delivery means comprising first and second downwardly directed outlet openings (26b, 28b), said outlet openings being spaced apart substantialy the width ofo the packages for establishing two vertical spaced apart columns (56,58) of falling treatment liquid; and conveyor means for conveying the packages between the treatment liquid delivery means outlet openigns (26b, 28b) and immersing the two rows of leads (22a) along the sides of the package in respective columns (56,58) of treatment liquid falling from the outlet openings therby washing the leads with treatment liquid.

11. The apparatus of claim 10 wherein the hot gas passageway means comprises first and second hot gas passageways having respective outlets positioned on either side of the conveyor means and constructed and oriented for directing streams of hot gas over the leads along the sides of integrated circuit packages as the packages pass from columns of falling molten solder.

12. The apparatus of claim 10 wherein the conveyor means comprises track section means defining a locus of solder finishing, said track section means comprising a channel for conveying integrated circuit packages through the locus of solder finishing, said solder delivery means being operatively coupled to the locus of solder finishing with the downwardly directed outlet openings being positioned on either side of the conveyor channel.

13. The apparatus of claim 12 wherein the locus of solder finishing comprises a recess or chamber formed in the track section means.

14. The apparatus of claim 13 wherein the solder delivery means outlet openings are positioned at the top of the recess or chamber formed in the track section means for establishing the falling columns of molten solder 15. The apparatus of claim 14 wherein the hot gas passageway means comprises first and second hot gas passageways having outlets positioned at the sides of the recess or chamber formed in the track section means adjacent to but downstream from the solder delivery means outlet openings in the direction of travel of integrated circuit packages through the locus of solder finishing for directing streams of hot gas from the sides of the recess or chamber onto the leads along the sides of the packages.

16. The apparatus of claim 10 further comprising pump means for delivering molten solder to the solder delivery means outlet openings under positive pressure.

17. The apparatus of claim 10 further comprising a solder pot, pump means for delivering molten solder from the solder pot through the first and second solder passageways to the solder passageway outlet openings, and ramp means positioned below the locus of solder finishing in the path of the columns of falling molten solder for diverting and directing the falling molten solder back to the solder pot.

18. The apparatus of claim 14 wherein the recess or chamber formed in the track section means defining the locus of solder finishing is open at the bottom and further comprising ramp means positioned below the opening for diverting and directing molten solder from the columns of falling molten solder to a solder receiving reservoir.

19. The apparatus of claim 10 wherein the conveyor means comprises elongate track section means having an elongate package conveyor channel for conveying packages through the track section means with the leads oriented in downwardly depending position, said track section means being formed with a chamber open at the bottom defining the locus of solder finishing, said channel passing through said chamber, and wherein the solder delivery means comprises first and second solder passageways constructed and arranged for delivering molten solder, said passageways each comprising a downwardly directed outlet formed in the top of the chamber, said outlets being spaced apart on either side of the channel a distance substantially the width of packages passing along the channel for establishing two vertically spaced apart columns of falling molten solder.

20. The apparatus of claim 19 further comprising molten solder reservoir means, pump means for pumping solder in the first and second solder passageways from the reservoir means and delivering molten solder at positive pressure at the solder passageway outlets, and ramp means positioned below the opening of the chamber for diverting and directing the columns of falling molten solder back to the reservoir means.

21. The apparatus of claim 19 wherein the channel is formed as an internal channel through the track section means, said track section means being formed with an elongate slot affording access to the channel for pushing integrated circuit packages along the channel and through the locus of solder finishing.

22. A method for liquid treating the leads of a package having two rows of leads along the sides of the package using treatment liquid comprising:
 establishing two vertical columns of falling treatment liquid and spacing the columns apart a distance substantially the width of the package:
 passing the package between the vertical columns of falling treatment liquid and immersing the two rows of leads along the sides of the package in the respective columns of treatment liquid, treating the leads with treatment liquid; and
 directing hot nonreactive gas over the leads of the package as the package passes from the columns thereby eliminating accumulation of excess treatment liquid.

23. The method of claim 22 wherein the treatment liquid is flux.

24. Apparatus for liquid treating the leads of packages having two rows of leads along the sides of the package using treatment liquid comprising:
 treatment liquid delivery means constructed and arranged for delivering treatment liquid, said delivery means comprising first and second downwardly directed outlet openings, said outlet openings being spaced apart substantially the width of the packages for establishing two vertical spaced apart columns of falling treatment liquid;
 conveyor means for conveying the packages between the treatment liquid delivery means outlet openings and immersing the two rows of leads along the sides of the package in respective columns of treatment liquid falling from the outlet openings thereby washing the leads with treatment liquid:
 and hot gas passageway means constructed and arranged adjacent to the treatment liquid delivery means for directing hot gas over the leads of packages as the packages pass from the columns of falling treatment liquid thereby eliminating accumulation of excess treatment liquid.

25. The apparatus of claim 26 wherein the treatment liquid is flux.

* * * * *